United States Patent
Florian et al.

(10) Patent No.: US 7,432,639 B2
(45) Date of Patent: Oct. 7, 2008

(54) PIEZOELECTRIC COMPONENT

(75) Inventors: Heinz Florian, Bad Gams (AT); Marion Ottlinger, Deutschlandsberg (AT)

(73) Assignee: EPCOS AG, Munich (DE)

( * ) Notice: Subject to any disclaimer, the term of this patent is extended or adjusted under 35 U.S.C. 154(b) by 379 days.

(21) Appl. No.: 10/532,433

(22) PCT Filed: Oct. 27, 2003

(86) PCT No.: PCT/DE03/03568

§ 371 (c)(1), (2), (4) Date: Oct. 28, 2005

(87) PCT Pub. No.: WO2004/040664

PCT Pub. Date: May 13, 2004

(65) Prior Publication Data

US 2006/0119228 A1    Jun. 8, 2006

(30) Foreign Application Priority Data

Oct. 25, 2002    (DE) .................... 102 49 900

(51) Int. Cl.
*H01L 41/187* (2006.01)
(52) U.S. Cl. ..................................... 310/358
(58) Field of Classification Search ............... 310/358; 252/62.9 R, 62.9 PZ; 501/134
See application file for complete search history.

(56) References Cited

U.S. PATENT DOCUMENTS 6,773,621 B2    8/2004    Hammer

2002/0098333 A1    7/2002    Feltz et al.
2004/0140535 A1*    7/2004    Kondo et al. ........... 257/646

FOREIGN PATENT DOCUMENTS

| WO | WO01/45138 | 6/2001 |
| WO | WO02/055450 | 7/2002 |

OTHER PUBLICATIONS

Barlingay C. K. et al, "Dopant Compensation Mechanism and Leakage Current in Pb($Zr_{0.52}$,$Ti_{0.48}$)$O_3$ Thin Films", Thin Solid Films, 1996, Elsevier, Switzerland, Bd. 272, Nr. 1, pp. 112-115.

Barlingary C. K. et al, "Observation of Sol-gel Solid Phase Epitaxial Growth of Ferroelectric Pb(Nb,Zr,Ti)$O_3$ Thin Films on Sapphire", Applied Physics Letters, 1992, USA, Bd. 61, Nr. 11, pp. 1278-1280.

Zou Q. et al, "Microstructural Characterization of Donor-doped Lead Zirconate Titanate Films Prepared by Sol-gel Processing", Preparation and Characterization, Elsevier Sequoia, NL, Bd. 402, Nr. 1-2, 2002, pp. 65-70.

Remiens D. et al, "Piezoelectric Properties of Sputtered PZT Films: Influence of Structure, Micro Structure, Film Thickness (Zr, Ti) Ratio and Nb Substitution", Materials Science in Semiconductor Processing, Elsevier Science Publishers B. V., Barking UK, Bd. 5, Nr. 2-3, 2002, pp. 123-127.

* cited by examiner

*Primary Examiner*—Darren Schuberg
*Assistant Examiner*—Derek J Rosenau
(74) *Attorney, Agent, or Firm*—Fish & Richardson P.C.

(57) ABSTRACT

A piezoelectric component includes a stack of ceramic layers and electrode layers between ceramic layers in the stack. The electrode layers contain copper and the ceramic layers contain lead-zirconate-titanate that is doped with Nb. The ceramic layers are made from a material having a composition of $Pb_{0.988}V_{0.012}(Zr_{0.504+x}Ti_{0.472-x}Nb_{0.024})O_{3.000}$, where $-0.05 \leq x \leq 0.05$.

19 Claims, No Drawings

PIEZOELECTRIC COMPONENT

TECHNICAL FIELD

The invention relates to the development of piezoelectric ceramic materials for use in multilayer components with Cu internal electrodes, which are characterized by a low power loss with good deflection.

BACKGROUND

A solution known from WO 01/45138 is based on the use of a ceramic material of the composition $Pb_{0.97}Nd_{0.02}(Zr_{0.5515}Ti_{0.4485})O_3$ in piezostacks with Cu internal electrodes, the production thereof is carried out by binder removal and sintering in air.

The properties of the known actuators with the ceramic composition $Pb_{0.97}Nd_{0.02}(Zr_{0.5515}Ti_{0.4485})O_3$ with in each case 360 internal electrodes and a ceramic layer thickness of 80 μm in sintering together with Cu internal electrodes are summarized in the following table, such as they are measured after a polarization with E=2 kV/mm (a) at room temperature and (b) at 180° C. Apart from the small-signal properties of the dielectric constants (DC) and the temperature dependence of the DC, the large-signal dielectric constant is also indicated here, which can be calculated from the polarization by means of a voltage, which for example leads in the case of the actuators to a deflection of 40 μm.

|   | Small-signal DC | Large-signal DC | TK ppm/K | $D_{33}$ pm/V | Wg % | E mJ |
|---|---|---|---|---|---|---|
| a | 1214 ± 30 | 3110 ± 87 | 3936 ± 82 | 592 ± 18 | 50.4 ± 0.4 | 50 ± 2 |
| b |  | 2772 ± 50 |  | 632 ± 11 | 56.5 ± 0.4 | 34 ± 1 |

By means of the polarization at higher temperature, the efficiency is improved from 50% to 56% and the energy loss is reduced from 50 mJ to 34 mJ.

SUMMARY

A ceramic material of the composition $Pb_{0.988}V_{0.012}(Zr_{0.504+x}Ti_{0.472-x}Nb_{0.024})O_{3.000}$ is specified according to the invention, whereby $-0.05 \leq x \leq 0.05$.

Furthermore, additional advantageous aspects of the invention are:

1. Adjustment of the Ti/Zr ratio to the morphotropic phase boundary.
2. Incorporation of $Nb^{5+}$ on Zr/Ti locations in the perovskite structure with donor function according to the composition $Pb_{0.988}V_{0.012}(Zr_{0.504+x}Ti_{0.472-x}Nb_{0.024})O_{3.000}$, whereby V stands for a vacancy.
3. Sintering together with Cu internal electrodes at 1000° C.

Further advantages are:

1. The verification that an Nb-doped, Ag-free ceramic of the composition $Pb_{0.988}V_{0.012}Zr_{0.504+x}Ti_{0.472-x}Nb_{0.02403}$ is adapted in an advantageous way to the morphotropic phase boundary. With the formula $Pb_{0.988}V_{0.012}Zr_{0.504}Ti_{0.472}Nb_{0.02403}$, a suitable analytical composition has been obtained that leads to small piezoelectric losses with acceptable deflection.
2. The deflection and energy loss of the actuator are determined through the defined incorporation of $Cu_2O$ during the sintering and the control of the grain-size growth through the Nb incorporation and the appropriate sintering temperature.
3. The incorporation of $Nb_2O_5$ is already successful during the conversion of the raw material mixture together with the other oxide raw materials in air at 925° C.
4. After the sintering of the ceramic material $Pb_{0.988}V_{0.012}Zr_{0.504}Ti_{0.472}Nb_{0.024}O_3$ with Cu internal electrodes under reduced oxygen partial pressure, such as corresponds to the $Cu/Cu_2O$ equilibrium, the dielectric constant displays a smaller dependence over temperature than with the use of an Nd-doped ceramic body $Pb_{0.97}V_{0.1}Zr_{0.55515}Ti_{0.4485}O_3$.

DETAILED DESCRIPTION

Examples of embodiment are described in the following. The precursor $(Zr, Ti)O_2$ and $PbCO_3$ or $Pb_3O_4$, produced from $TiO_2$, $ZrO_2$ or one produced by mixed precipitation, and doping agents such as $Nb_2O_5$ or another oxide of the raw material mixture consisting of rare earth elements, is weighed-in with a composition corresponding to the morphotropic phase boundary and a PbO excess of at most 5% to promote to the sintering densification, subjected to a grinding stage for the equal distribution of the components in aqueous suspension and, after filtering and drying, calcined at 900 to 950° C. in air. A piezoceramic perovskite mixed crystal phase is thus formed. In order to achieve sintering densification in 2-8 hours at 1000° C. below the melting temperature of copper, fine grinding is required down to an average grain size of 0.4-0.6 μm. The sintering activity of the powder then proves to be sufficient to produce a densification >97% of the theoretical density with at the same time adequate grain growth and adequate mechanical strength in the ceramic structure.

By using a dispersing agent, the finely ground powder is suspended to form an aqueous slurry with approx. 70 m % solid content, which corresponds to approximately 24 vol. %. The proportion of dispersing agent that is just needed for optimum distribution is ascertained separately in a series of tests, this being able to be detected when a viscosity minimum is reached. For the formation of the piezoceramic green films, approx. 6 m-% of a commercially available binder that is thermohydrolytically degradable is added to the dispersed solid powder suspensions. An aqueous polyurethane dispersion proves to be advantageous for this. Mixing is carried out for example in a Dispermat mill and a slurry suitable for the film-drawing process or for the production of a spray granulate is thus obtained.

Disc-shaped pressed pieces produced from the granulate, or multilayer platelets "MLP", obtained by stacking one on top of another and lamination from 40 to 50 μm thick green films without printing with Cu electrode paste, can be liberated from binder down to a residual carbon <300 ppm in an inert-gas atmosphere containing $H_2O$ vapor at a defined oxygen partial pressure that meets the condition of the coexistence of PbO-containing piezoceramic material and copper. The hydrolytic separation of the binder takes place mainly at the relatively low temperature of 220±50° C. at a water-vapor partial pressure greater than 200 mbar. The oxygen partial pressure is adjusted to a value that is compatible with the Cu-containing electrodes. This takes place by gettering of the oxygen from the gas flow at large surfaces of Cu or by the metered addition of hydrogen. The electrode layers do contribute to binder removal insofar as they provide preferred paths for transporting away the binder, nonetheless a considerable binder removal time is required, especially for actuators with a large number of electrodes.

The electrical properties of the compact samples in the series of variable composition and those of actuators with Cu internal electrodes with optimized ceramic composition are given in the following tables.

TABLE 1

Properties of compact square ceramic samples MLP (edge length a = 11.5 mm, thickness h = 1 mm) in the series $Pb_{0.988}V_{0.012}(Zr_{0.504+x}Ti_{0.472-x}Nb_{0.024})O_{3.000}$ for the purpose of determining the morphotropic phase boundary with indication of the average statistical error from, in each case, 5 individual samples after sintering at 1000° C.

| Type of polarization | x | $\in$ (2 kV/mm) | $D_{33}$ [pm/V] | Eloss/V [mJ/mm³] | $\eta$ [%] |
|---|---|---|---|---|---|
| 25° C./E = 2 kV/mm | 0 | 3043 ± 47 | 572 ± 12 | 31086 ± 323 | 44 ± 0.5 |
| | +0.01 | 3469 ± 64 | 524 ± 6 | 43313 ± 2169 | 30 ± 2 |
| | −0.01 | 2926 ± 94 | 390 ± 13 | 38801 ± 1334 | 26 ± 0.2 |
| 120° C./ 3 kV/mm | 0 | 2253 ± 133 | 518 ± 8 | 14378 ± 1628 | 57 ± 2 |
| | +0.01 | 2225 ± 65 | 464 ± 15 | 39035 ± 2305 | 37 ± 2 |
| | −0.01 | 1676 ± 42 | 409 ± 27 | 24627 ± 2504 | 48 ± 5 |

It can be seen that the d33 value runs through a maximum value at x=0. The composition for this Ti/Zr ratio also has the lowest energy loss. Accordingly, the formula $Pb_{0.988}V_{0.012}(Zr_{0.504}Ti_{0.472}Nb_{0.024})O_{3.000}$ corresponds to a ceramic material which is adapted to the morphotropic phase boundary. The energy loss is reduced by the polarization at 120° C. and higher field strength.

The properties of the constituted actuators with Cu internal electrodes with adaptation to the morphotropic phase boundary are described in tables 2 and 3.

TABLE 2

Performance data of piezoactuators

| Magnitudes | Unit | Low-loss ceramic in the actuator |
|---|---|---|
| Geometry: stack | mm³ | 6.8 × 6.8 × 30 |
| Stroke in tube spring | μm | 30 |
| Number of individual layers | | 360 |
| Individual layer thickness (sintered) | μm | 75 |
| Small-signal capacity polarized | μF | 2.9 ± 0.05 |
| Loss angle tan δ | mJ | 0.010 ± 0.001 |
| Total energy for 30 μm stroke | mJ | 57.8 ± 1.0 |
| Voltage U30 for 30 μm stroke | V | 162 ± 2 |
| Large-signal capacity | μF | 4.39 ± 0.07 |
| Temperature dependence of the small-signal capacity (polarized) in the temperature range between 20° C. 60° C. | ppm/K | 2335 ± 342 |
| Energy loss per 30 μm stroke | mJ | 19.1 ± 0.5 |
| Triggering field strength for 30 μm stroke | V/mm | 2160 ± 27 |
| $D_{33}$ at triggering field strength | Pm/V | 510 ± 42 |
| Charge Q30 for 30 μm stroke | mC | 0.712 ± 0.005 |
| Efficiency for 30 μm stroke | % | 67.0 ± 0.6 |

TABLE 3

Results of fatigue tests carried out

| Magnitudes | Unit | Change after 4.6.10 8 cycles |
|---|---|---|
| Voltage U30 | V | +(4.7 ± 0.9) % |
| Charge Q30 for 30 μm stroke | mC | −(2.6 ± 1.7) % |
| Energy for 30 μm stroke | mJ | −(3 ± 3) % |
| Energy loss per 30 μm stroke | mJ | −(12 ± 6) % |

Compared with the actuators containing a ceramic material $Pb_{0.97}V_{0.02}(Nd_{0.02}Zr_{0.5515}Ti_{0.4485})O_{3.000}$, the values in table 2 reveal an improvement in properties with respect to the piezoelectric losses and the temperature dependence of the small-signal capacity. With a deflection of the actuators of 30 μm, an energy loss of 20 mJ is measured. The temperature dependence of the dielectric small-signal capacity in the range between 20° C. and 60° C. is much less than with the use of the Nd-doped ceramic material. The results of the fatigue tests are shown in table 3.

Table 4 compares results of sintered and passivated actuators, when the pressure on the actuator is varied. Whilst the energy that is required for the extension of 30 μm remains of equal magnitude between 500 and 1000 N, the efficiency increases with a tendency from 61% to 63%.

TABLE 4

Pressure dependence of the efficiency, measured on sintered actuators after a polarization at room temperature with a field strength of 2 kV/mm

| Force [N] | U30 [V] | EPS large | E [mWs] | Q [mAs] | Wg [%] | Eloss [mWs] |
|---|---|---|---|---|---|---|
| 500 | 190 ± 3 | 2126 ± 54 | 76 ± 4 | 0.80 ± 0.03 | 61 ± 1 | 30 ± 2 |
| 800 | 191 ± 2 | 2120 ± 41 | 76 ± 3 | 0.79 ± 0.02 | 62.5 ± 0.4 | 28 ± 1 |
| 1000 | 191 ± 1 | 2131 ± 38 | 76 ± 2 | 0.80 ± 0.02 | 63.0 ± 0.5 | 28 ± 1 |

It has been shown that the average sintered grain size amounts to 0.7-1.0 μm and that the interior electrodes are free from holes.

The invention claimed is:

1. A piezoelectric component comprising:
   a stack of ceramic layers; and
   electrode layers between ceramic layers in the stack;
   wherein the electrode layers comprise copper; and
   wherein the ceramic layers comprise a material having a composition of $Pb_{0.988}V_{0.012}(Zr_{0.504+x}Ti_{0.472-x}Nb_{0.024})O_{3.000}$, where $-0.05 \leq x \leq 0.05$ and V stands for a vacancy.

2. The piezoelectric component of claim 1, wherein a ratio of Ti to Zr in the material corresponds to a morphotropic phase boundary.

3. The piezoelectric component of claim 1, wherein the ceramic layers are substantially free of Ag.

4. The piezoelectric component of claim 1, wherein the ceramic layers and the electrode layers are sintered together.

5. An actuator comprising the piezoelectric component of claim 1.

6. The actuator of claim 5 having a deflection of about 30 μm and an energy loss of about 20 mJ.

7. The piezoelectric component of claim 1 wherein a dielectric constant of the material varies less with temperature than does a dielectric constant of an Nd-doped ceramic having a composition of $Pb_{0.97}V_{0.01}Zr_{0.55515}Ti_{0.4485}O_3$.

8. The piezoelectric component of claim 1, wherein the electrode layers are substantially free of holes.

9. A piezoelectric component comprising:
ceramic layers comprise a material having a composition of $Pb_{0.988}V_{0.012}(Zr_{0.504+x}Ti_{0.472-x}Nb_{0.024})O_{3.000}$, where $-0.05 \leq x \leq 0.05$;
wherein a dielectric constant of the material varies less with temperature than does a dielectric constant of a specific ceramic doped with Nd.

10. The piezoelectric component of claim 9, wherein a ratio of Ti to Zr in the material corresponds to a morphotropic phase boundary.

11. The piezoelectric component of claim 9, wherein the ceramic layers are substantially free of Ag.

12. The piezoelectric component of claim 9, wherein the specific ceramic has a composition of $Pb_{0.97}V_{0.01}Zr_{0.55515}Ti_{0.4485}O_3$.

13. The piezoelectric component of claim 9, further comprising an electrode layer between at least two of the ceramic layers, the electrode layer being sintered with the at least two ceramic layers.

14. The piezoelectric component of claim 13, wherein the electrode layer comprises copper.

15. A piezoelectric actuator comprising:
a ceramic that is substantially free of Ag; and
electrode layers embedded in the ceramic, the electrode layers comprising copper;
wherein the ceramic comprises a material having a composition of $Pb_{0.988}V_{0.012}(Zr_{0.504+x}Ti_{0.472-x}Nb_{0.024})O_{3.000}$, where $-0.05 \leq x \leq 0.05$.

16. The piezoelectric actuator of claim 15, wherein a ratio of Ti to Zr in the material corresponds to a morphotropic phase boundary.

17. The piezoelectric actuator of claim 15 having a deflection of about 30 μm and an energy loss of about 20 mJ.

18. The piezoelectric actuator of claim 15, wherein a dielectric constant of the material varies less with temperature than does a dielectric constant of an Nd-doped ceramic having a composition of $Pb_{0.97}V_{0.01}Zr_{0.55515}Ti_{0.4485}O_3$.

19. The piezoelectric actuator of claim 15, wherein at least one of the electrode layers is substantially free of holes.

* * * * *